US005394006A

United States Patent [19]
Liu

[11] Patent Number: 5,394,006
[45] Date of Patent: Feb. 28, 1995

[54] NARROW GATE OPENING MANUFACTURING OF GATED FLUID EMITTERS

[75] Inventor: David N.-C. Liu, Fong-Yuan, Taiwan, Prov. of China

[73] Assignee: Industrial Technology Research Institute, Hsinchu, Taiwan, Prov. of China

[21] Appl. No.: 177,521

[22] Filed: Jan. 4, 1994

[51] Int. Cl.⁶ .......................... B44C 1/22; C23F 1/02; H01L 31/00

[52] U.S. Cl. .................................... 257/506; 313/310; 313/336; 445/50; 445/51

[58] Field of Search ........................... 257/10, 11, 506; 313/310, 336, 351, 309; 445/50, 51, 46, 49, 24

[56] References Cited

U.S. PATENT DOCUMENTS

| | | | |
|---|---|---|---|
| 4,766,340 | 8/1988 | van der Mast et al. | 313/366 |
| 4,857,161 | 8/1989 | Borel et al. | 204/192.26 |
| 4,964,946 | 10/1990 | Gray et al. | 156/643 |
| 5,151,061 | 9/1992 | Sandhu | 445/24 |
| 5,186,670 | 2/1993 | Doan et al. | 445/24 |
| 5,188,977 | 2/1993 | Stengl et al. | 437/89 |
| 5,229,331 | 7/1993 | Doan et al. | 437/225 |

OTHER PUBLICATIONS

"Fabrication of Self-Aligned Gated Field Emitters", Journal of Micromechenical Microengineering 2 (1992), pp. 21-24.

*Primary Examiner*—Jerome Jackson
*Assistant Examiner*—Donald L. Monin, Jr.
*Attorney, Agent, or Firm*—George O. Saile; Stephen B. Ackerman

[57] ABSTRACT

A method of forming a self-aligned gated field emitter with reduced gate opening and uniform gate height, on a substrate, is described. A field emitter is formed on the substrate. A thin, conformal dielectric layer is formed over the field emitter and the substrate. A thick dielectric layer is formed over the thin, conformal dielectric layer. The thick dielectric layer is planarized. The thick dielectric layer is etched back. A conductive layer is formed over the thick dielectric layer. The conductive layer is planarized and then etched back. The field emitter is exposed by forming an opening in the conductive layer, by removing the portion of the thin, conformal dielectric layer above and around the top of the field emitter.

27 Claims, 10 Drawing Sheets

NARROW GATE OPENING MANUFACTURING OF GATED FLUID EMITTERS

BACKGROUND OF THE INVENTION (1) Field of the Invention

The invention relates to a process for making self-aligned gated field emitter devices which can be used for various applications including flat panel displays, electron sources for lithography and the like, memory writing devices, sensors and high speed switching devices.

(2) Description of the Related Art

Field emission devices have received increased attention in recent years, as integrated circuit manufacturing techniques have allowed for further miniaturization and new applications. Typically, one or many of a small, conical conductive emitter tip are formed on a conductive cathode. A second conductive surface, or gate, is formed in close proximity and parallel to the cathode surface, with the two surfaces separated by a dielectric layer. Apertures are formed in the gate layer and dielectric in the area of the emitter tips, with the gate opening surrounding the upper part of the emitter. When a positive bias is applied at the gate with respect to the cathode, electrons are emitted from the small emitter tip, with the current generated depending on the operating voltage, the sharpness of the tip and the emitter material work function.

One application for field emission devices is in the area of computer displays, where there is an increasing trend toward flat, thin, lightweight displays to replace the traditional cathode ray tube (CRT) device. One of several technologies that provide this capability is field emission displays (FED). An array of very small, conical emitters is manufactured, typically on a semiconductor substrate, and can be addressed via a matrix of columns and lines. These emitters are connected to a cathode, and surrounded by a gate. When the proper voltages are applied to the cathode and gate, electrons are emitted and attracted to the anode, on which there is cathodoluminescent material that emits light when excited by the emitted electrons, thus providing the display element. The anode is typically mounted in close proximity to the cathode/gate/emitter structure and the area in between is typically a vacuum.

There are several methods for fabricating the gated field emitters. One such process is taught in U.S. Pat. No. 4,857,161 by Borel et al. Another process uses a silicon oxide mask on a silicon wafer and the silicon is etched under the mask until a pointed silicon structure remains under the mask. Then the dielectric and conductor layer are deposited thereover and the "hat" removed. A third process forms the emitter tip first and then forms the dielectric and conductive layers thereover. An etchback is required to expose the emitter tip. This third method is shown for example in U.S. Pat. No. 5,186,670 to Doan et al. Other methods for fabricating gated field emitter include those shown in U.S. Pat. No. 5,151,061 to Sandhu and U.S. Pat. No. 5,188,977 to Stengl et al.

The FIGS. 1 through 4 illustrate how Borel et al fabricate their gated field emitter. Typically a silicon wafer 10 is used as the substrate. A dielectric layer 12, such as silicon oxide is formed over the wafer 10. A conducting coating 14 is formed over the dielectric layer 12. Thereafter, using lithography and etching techniques openings 15 are formed through the conducting layer 14 and dielectric layer 12 to the silicon wafer 10 to produce FIG. 1. A lift off layer 16, which could be composed of nickel, aluminum, aluminum oxide or the like is formed over the layer 14 at a low angle to prevent deposit within the hole 15 to produce FIG. 2. Molybdenum or the like is deposited under normal incidence to form emitters 18 within the openings and layer 20 on the surface of the lift off layer 18 as can be seen in FIG. 3. The gated field emitter is completed as seen in FIG. 4, with the lift off of the layer 20 by selectively dissolving the layer 16.

All of the above mentioned fabrication process for gated field emitters have serious drawbacks. The Borel et al process has several serious problems including (1) the lift off of the layer 20 by means of lift off layer 16 is difficult, (2) the reduction of the gate opening is limited and therefore operating voltages must be kept high, on the order of 80 to 100 volts, and (3) the formation of the lift off layer 16 requires a very low angle deposition to prevent any of the material from entering the openings 15. The "hat" method has many problems including (1) some of the "hats" fall off during etching causing reliability problems, (2) gate opening reduction is limited and therefore requires high operating voltages on the order of 80 to 100 volts and (3) only silicon and tantalum have been reported as material candidates for emitter. The third method of Doan et al has many problems which include (1) the gate cannot be made planar and (2) the device has a high capacitance and high leakage current, since in order to have the necessary gate opening the dielectric thickness must be minimized.

In "Fabrication of Self-aligned Gated Field Emitters", Journal of Micromechanical Microengineering, 2(1992), pp. 21-24, Liu et al describe a method for forming a conformal insulating layer over the emitter tip that provides a reduced gate opening. However, the emitter is exposed during the latter processing steps and thus subject to contamination. Emitter contamination can affect the work function of the emitter material in an irregular manner and result in severe fluctuation of emission. In U.S. Pat. No. 5,229,331, Doan et al also describe the use of a conformal insulating layer, however the gate-to-cathode insulating layer is formed of a flowable material and is planarized by a high-temperature reflow process.

SUMMARY OF THE INVENTION

It is therefore a principle object of the invention to provide a simple and very manufacturable method for forming a gated field emitter device with the capability to reduce the gate opening.

Another object is to provide a method for making self-aligned gated field emitters in a planar structure with a sufficiently thick dielectric that is formed without high-temperature processing.

Another object is to provide a method for making self-aligned gated field emitters which exposes the emitter at the last processing step to prevent contamination, and which is without limitation as to substrate or emitter material.

A further object of the invention is to provide a method for making self-aligned gated field emitters with increased uniformity of gate elevation.

In accordance with the present invention, a method of forming a self-aligned gated field emitter on a substrate is described. A field emitter is formed on the substrate. A thin, conformal dielectric layer is formed over the field emitter and the substrate. A thick dielectric layer is formed over the thin, conformal dielectric layer. The thick dielectric layer is planarized. The thick dielectric layer is etched back. A conductive layer is formed over the thick dielectric layer. The conductive layer is planarized and then etched back. The field emitter is exposed by forming an opening in the conductive layer, by removing the portion of the thin, conformal dielectric layer above and around the top of the field emitter.

DESCRIPTION OF THE PREFERRED EMBODIMENTS

Figure 1:
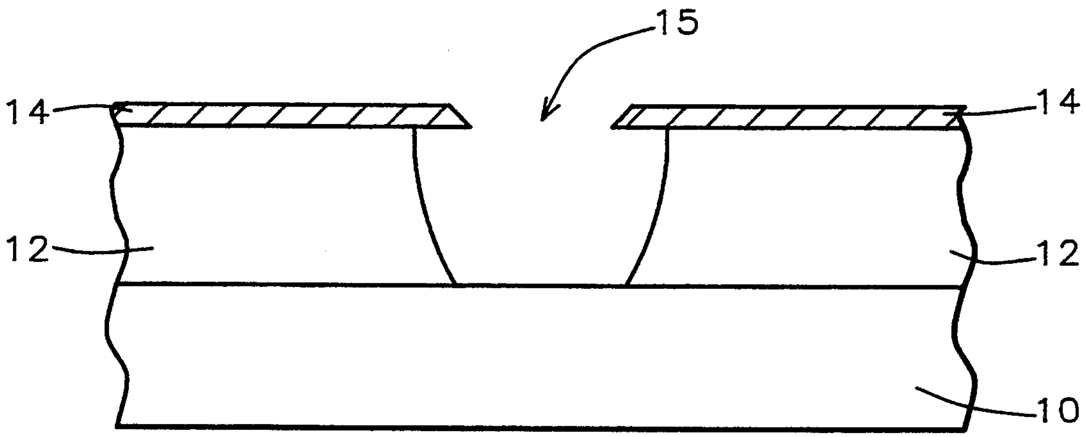
FIG. 1 Prior Art
FIGS. 1 through 4 show a schematic cross-sectional series of steps in a Prior Art process for fabricating a gated field emitter.
Figure 2:
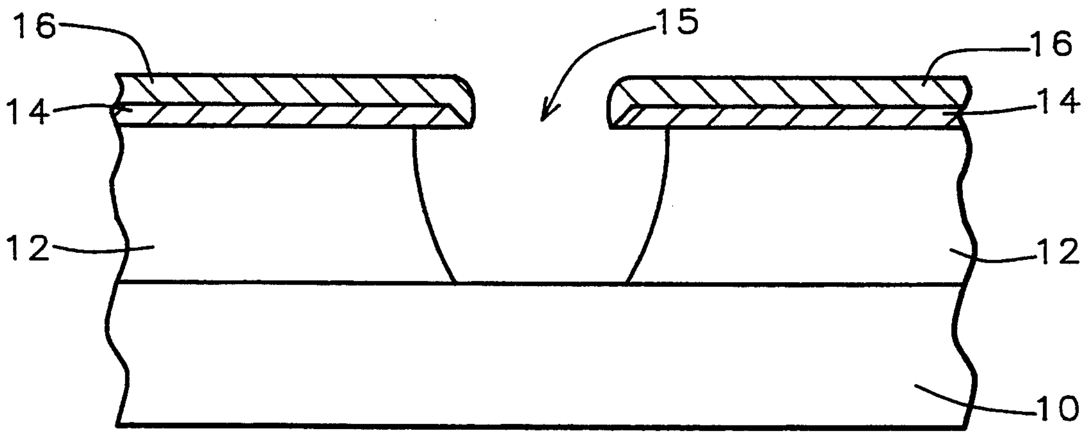
FIG. 2 Prior Art
Figure 3:
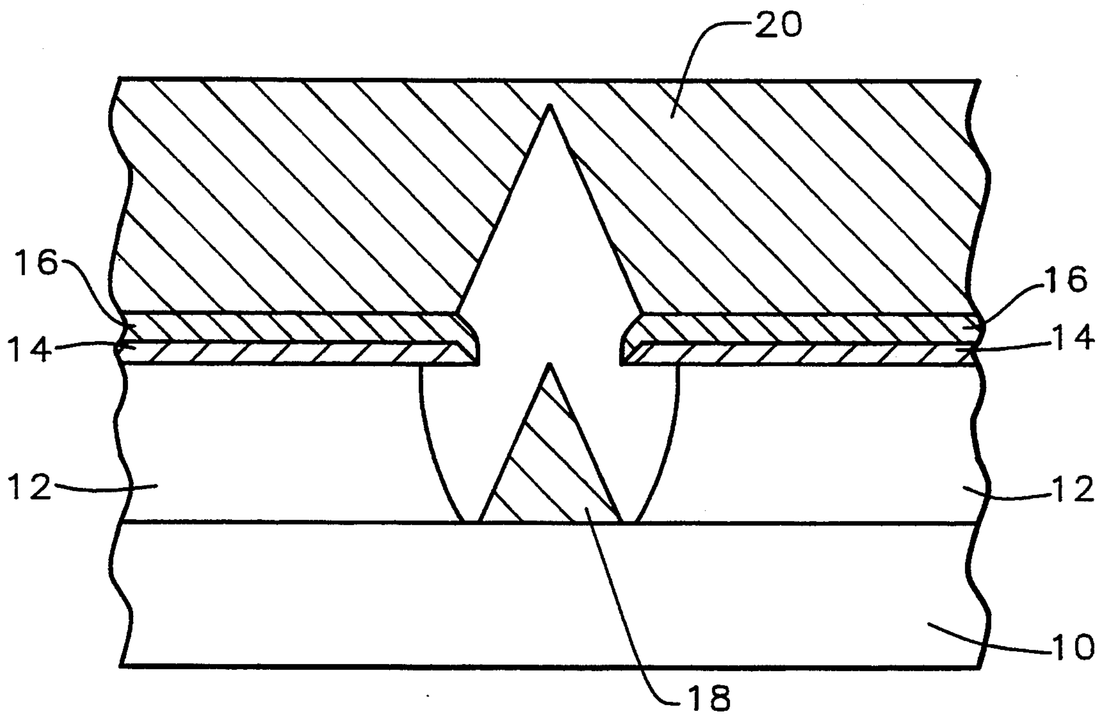
FIG. 3 Prior Art
Figure 4:
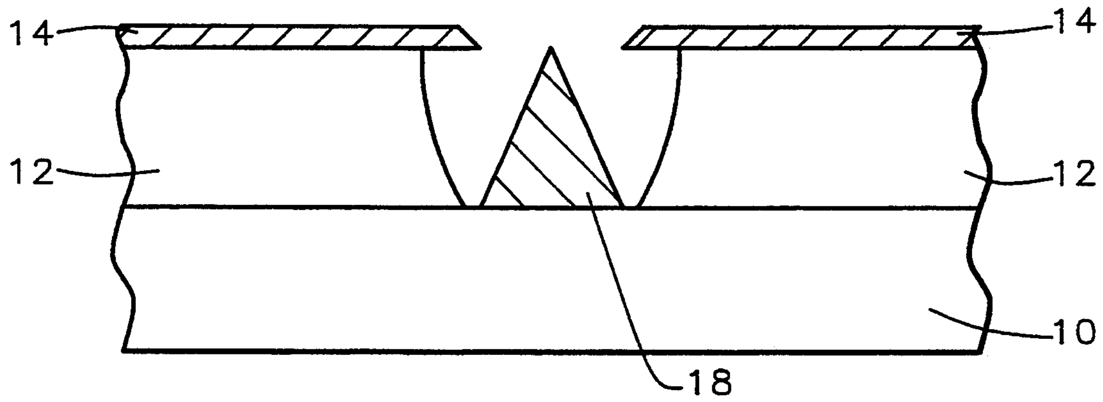
FIG. 4 Prior Art
Figure 5:
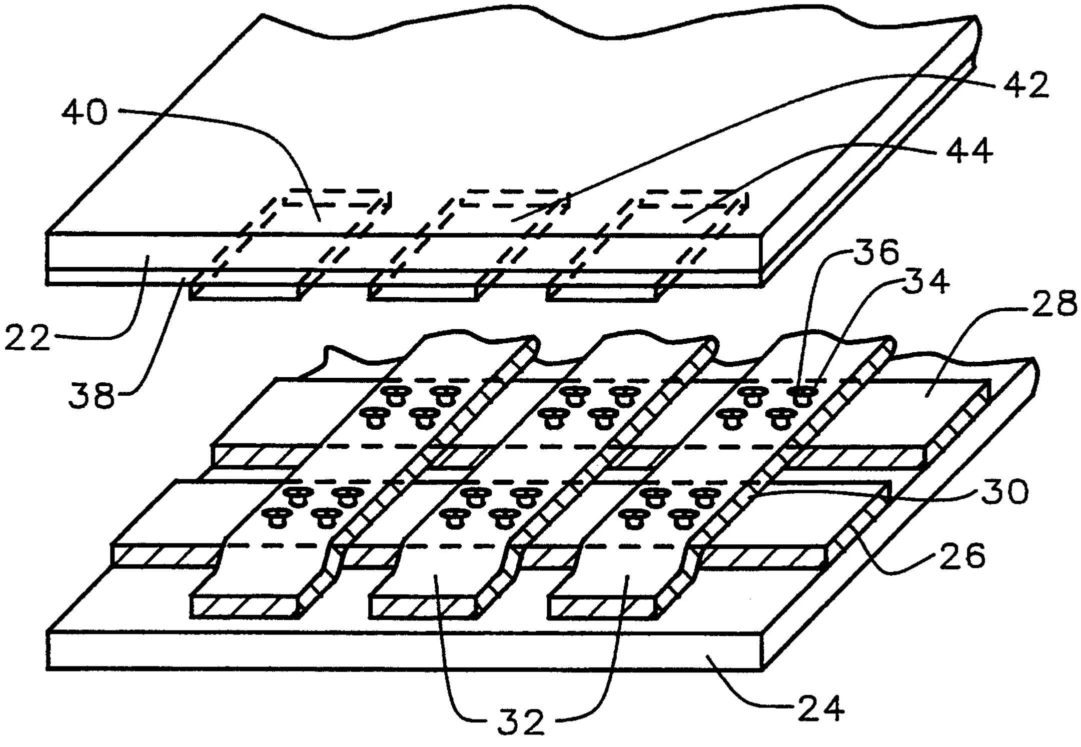
FIGS. 5 and 6 show a schematic representation of a flat panel display using the gated field emitter structure of the invention.
Figure 6:
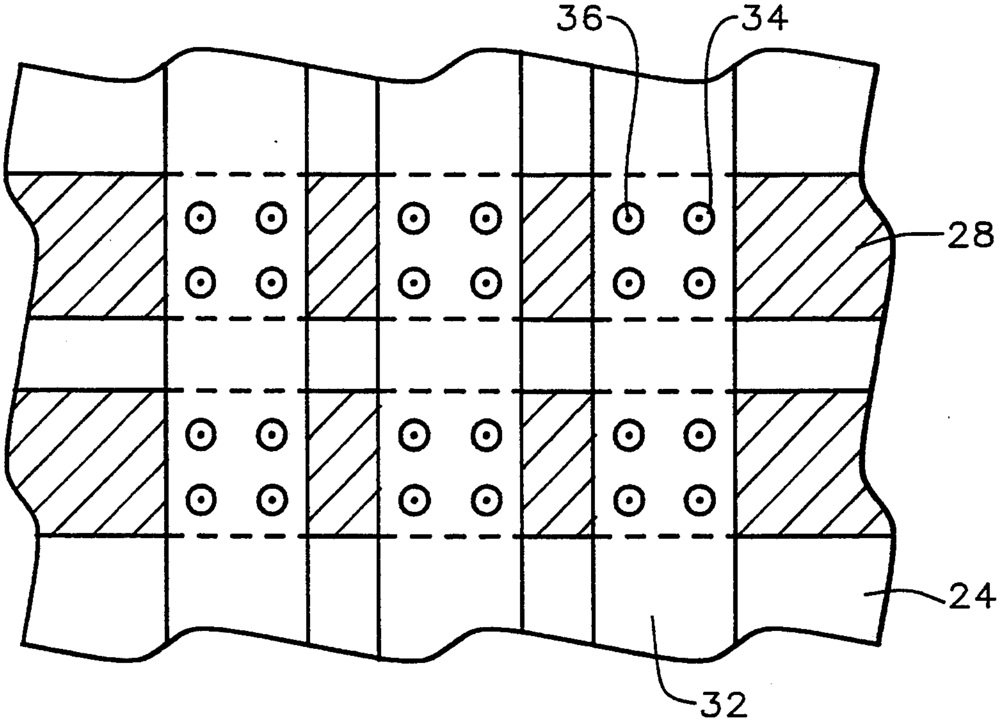

Referring now more particularly to FIGS. 5 and 6, there is shown a basic structure of a flat panel display, one application for which the present invention could be used. Two opposing plates are sandwiched together and provide the surfaces for the various structures and materials that make up the display. Front glass plate 22 serves as the anode, and back glass (which may also be silicon) plate 24 serves as a cathode. A first series of parallel conductive and/or resistive cathode columns 28 are formed on parallel insulating strips 26. A second series of parallel conductive metallic gate lines 32 are formed on parallel insulating strips 30, above and perpendicular to the columns, and form the "lines" of the display. A plurality of holes 34 are formed in the gate lines, at the line/column intersections. Within the holes are the self-aligned gated field emitters 36 of the invention, which are in contact with cathode columns 28.

A thin conductive layer 38 of, for instance, indium tin oxide, is used to coat front glass plate 22, and provides a base for phosphors red 40, green 42 and blue 44, which emit their respective colored light when struck by electrons emitted from the self-aligned gated field emitters 36. These electrons are emitted when an electric field is formed between the cathode and gate lines and then accelerated toward the phosphors due to the voltage bias of the anode.

FIG. 6 shows a top view of the back plate structure. Each hole 34 in gate line 32 contains one self-aligned gated field emitter 36 with its center point at the center of the hole. Gate lines 32 are perpendicular to cathode columns 28, and both are formed over back plate 24.

Referring now to FIGS. 7 through 17, the detailed way in which the self-aligned gated field emitters are formed can be more fully understood. These figures show only a single field emitter being formed, but it is understood by those skilled in the art that the process of the invention can be used to simultaneously form thousands of these emitters.

Figure 7:
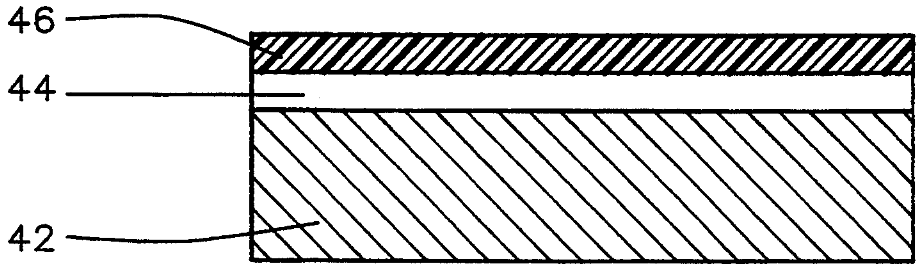
FIGS. 7 to 17 show a method by a schematic cross-sectional series of steps for fabricating a gated field emitter of the present invention.
Figure 8:
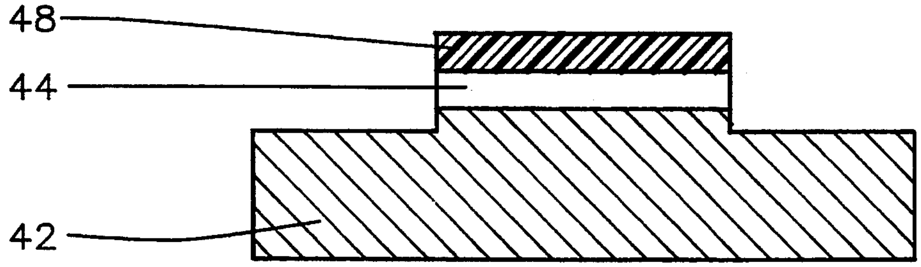

The first series of steps are to form the emitter tip, and are shown in FIGS. 7 through 10. Referring now to FIG. 7, a silicon substrate 42 is shown. A layer of silicon oxide 44 is grown thermally, by methods well known in the art, to a thickness of between about 1000 and 3000 Angstroms. This layer could also be formed by chemical vapor deposition (CVD), evaporation or sputtering. A suitable resist layer 46 is spin coated as is well understood by those skilled in the art onto the layer 44. The resist is exposed through a mask and developed to form the desired resist mask layer 48 shown in FIG. 8, wherein the masked region is at the planned locations of the gated field emitters to be fabricated. The silicon oxide 44 and a portion of substrate 42 are then etched by a reactive ion etch as is well known in the art, to result in the FIG. 8 structure. The resist mask 48 is then removed.

Figure 9:
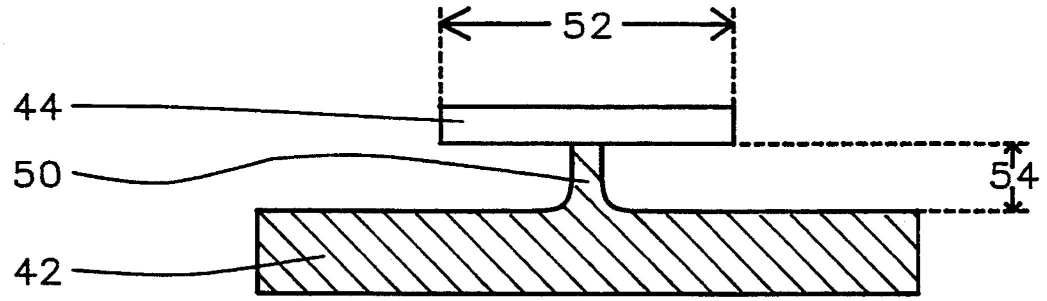

Referring now to FIG. 9, a wet etch using nitric acid, acetic acid and hydrofluoric acid, for between about 2 and 4 minutes is accomplished, to etch away silicon 42 in both a vertical and horizontal direction, in order to form emitter tip 50. Silicon oxide mask 44 has a width 52 of between about 1 and 3 micrometers, which results in an emitter tip height 54 of between about 0.5 and 1.5 micrometers. Silicon oxide mask 44 is now removed using hydrofluoric acid. Emitter 50 is oxidized at a temperature of between about 950° and 1050° C. for between about 2.5 and 5.5 hours to grow a silicon oxide, which is then removed by etching with hydrofluoric acid, resulting in the FIG. 10 tip structure.

Figure 11:
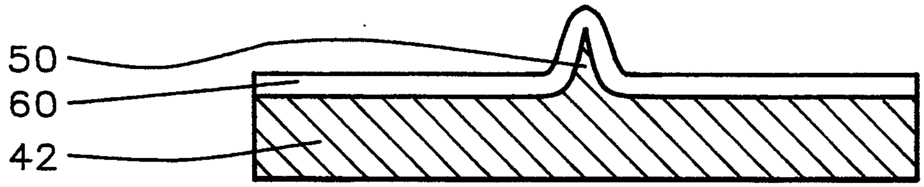

In a critical step in the invention, referring now to FIG. 11, a thin, conformal dielectric layer 60 is conformally formed over emitter 50 and substrate 42 to a thickness of between about 1000 and 5000 Angstroms. This layer may be silicon oxide deposited by Chemical Vapor Deposition (CVD), formed by reacting silane, nitrous oxide and argon at a temperature of about 300° C., for between about 20 and 100 minutes. This layer could also be grown thermally in dry oxygen at a temperature between about 950 and 1050° C. for between about 2 and 50 hours, to form silicon oxide. Additionally, silicon nitride ($Si_3N_4$) deposited by CVD could be used for layer 60.

Figure 12:
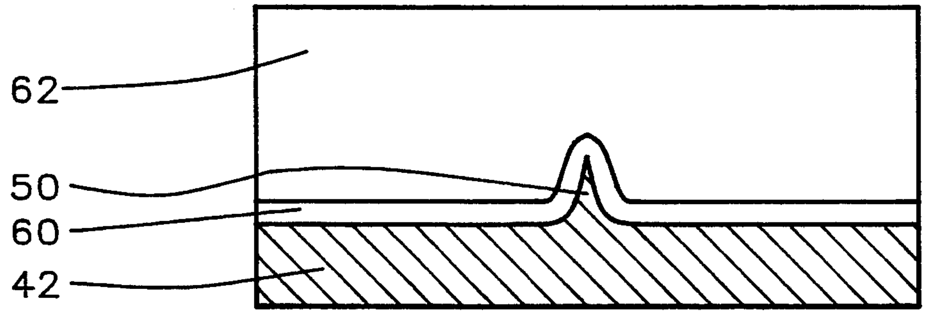

Referring now to FIG. 12, a second dielectric layer 62 is formed over the first thin dielectric 60, to a thickness of between about 7000 and 50,000 Angstroms. This layer may be formed in a variety of ways, for example, by spin-on glass (SOG), or by spinning on polyimide, both of which are well known in the art. The SOG is cured at a temperature of between about 105° and 155° C. for between about 25 and 35 minutes to provide a planar top surface. This specially cured SOG will not be attacked by HF (hydrofluoric acid) or buffered HF. Polyimide would be similarly cured, at a temperature of between about 320° and 480° C. for between about 25 and 35 minutes. Layer 62 could also be formed by chemical vapor deposition of silicon oxide.

Layer 62 is now planarized by flattening techniques, as are well known in the art, such as lapping, polishing or the like, for instance by chemical mechanical polishing.

The possible combinations of layers 60 and 62 include, respectively, (1) silicon oxide and specially-cured SOG, (2) silicon nitride and silicon oxide, or (3) silicon oxide and polyimide. These combinations provide a high etching selectivity between layers 60 and 62, as well as providing high dielectric strength.

Figure 13:
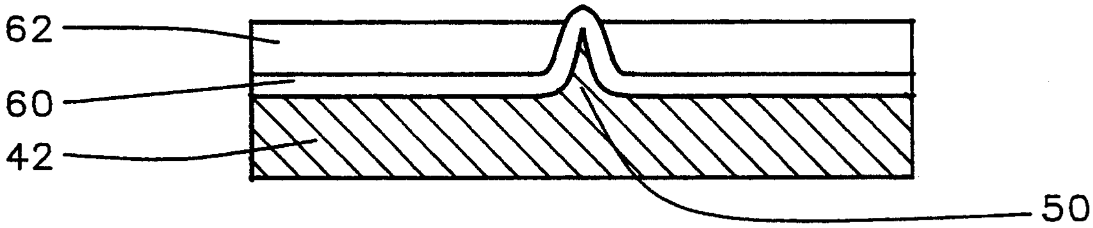

Referring now to FIG. 13, layer 62 is etched back so that a small portion of first dielectric layer 60 is exposed, in the area surrounding the tip of emitter 50. The specially-cured SOG can be etched by $C_2F_6$ reactive ion etching, with a flow rate of 5 sccm at 30 mtorr pressure and 100 W power. The etch ratio of the SOG to CVD silicon oxide is 2.2 to 1.0, and the SOG etch rate is about 650 Angstroms/minute.

Figure 14:
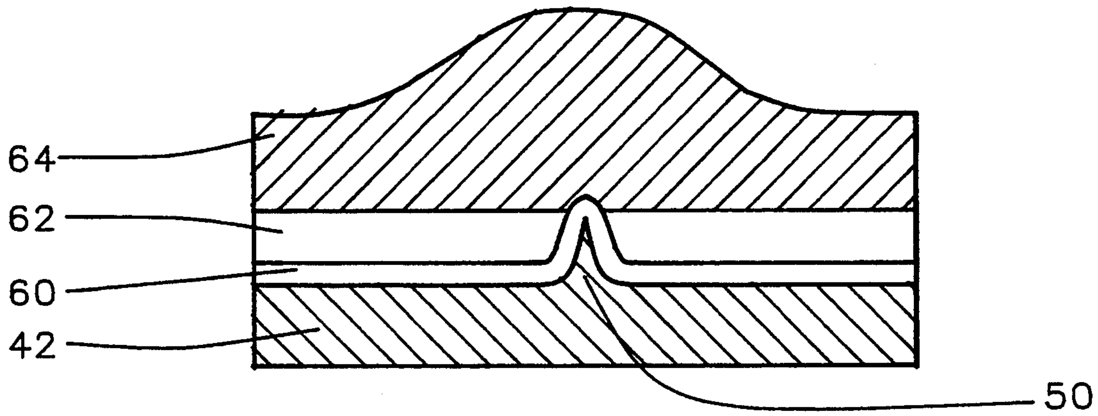
Figure 15:
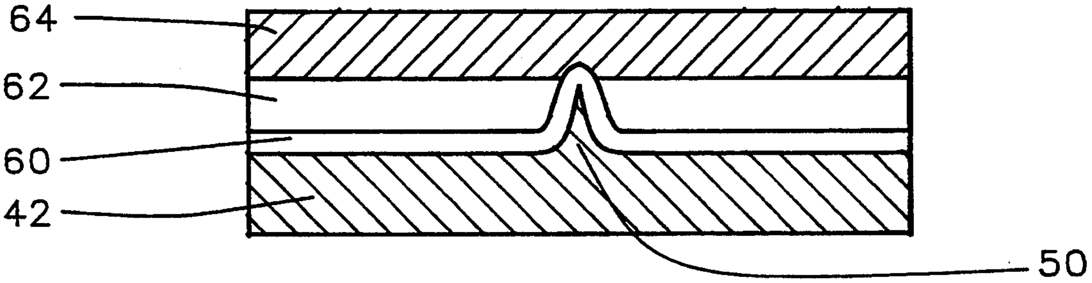
Figure 16:
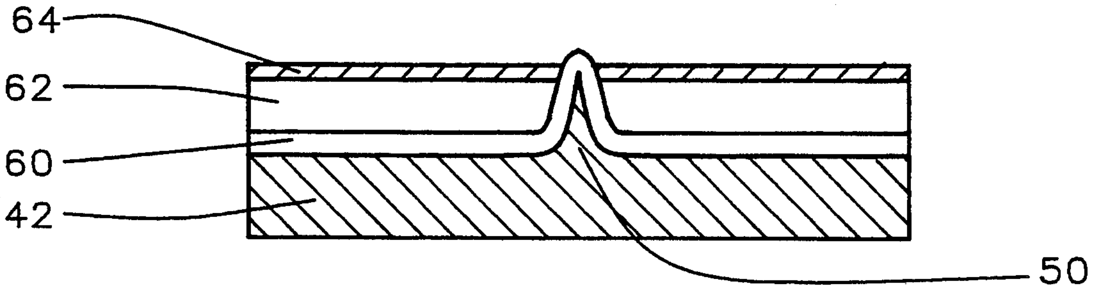

A conductive layer 64 is now deposited as shown in FIG. 14 to a thickness of between about 3000 and 10,000 Angstroms. The material used will form the gate for the emitter device, and can be a metal such as molybdenum, tungsten, aluminum or tantalum, deposited by sputtering or evaporation, or polysilicon, deposited by sputtering, evaporation or CVD. Layer 64 is then planarized by lapping, polishing, or the like, as is well known in the art, to create the structure shown in FIG. 15. Layer 64 is further etched back by reactive ion etching to a final thickness of between about 1000 and 3000 Angstroms, as shown in FIG. 16, such that a small portion of first dielectric 60 is exposed.

Figure 17:
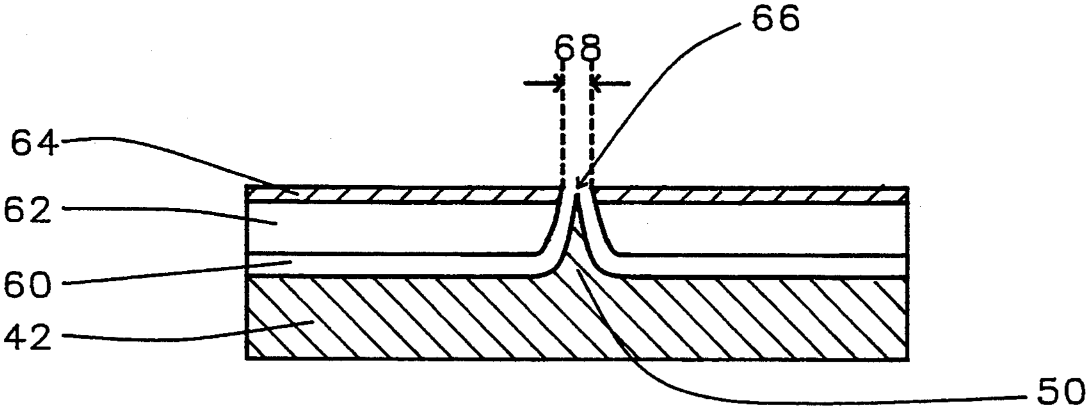
Figure 18:
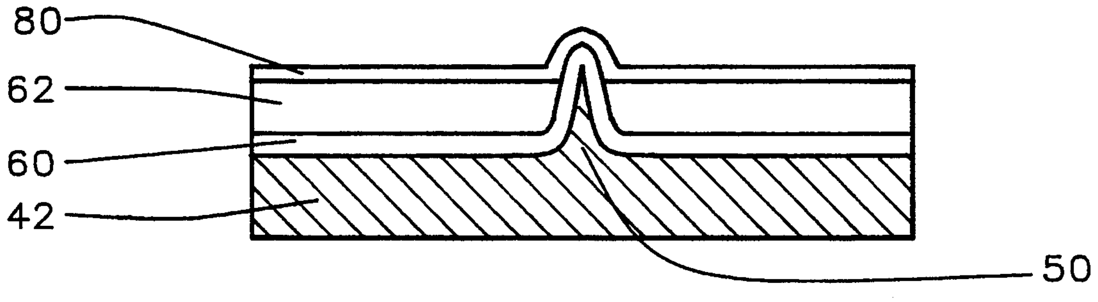
FIGS. 18 to 26 show a second embodiment of the invention by a schematic cross-sectional series of steps for fabricating a gated field emitter using a stop material.

Referring now to FIG. 17, the thin, conformal dielectric layer 60 is removed in the area around the emitter 50. This is accomplished by etching in buffered HF for between about 2 and 15 minutes. This completes formation of the self-aligned gated field emitter structure.

The gate opening 66 has a width 68 of between about 0.2 and 1.0 micrometers, and it can be seen that this width is controlled by the thickness of dielectric 60. The gate opening size is two times the thickness of layer 60 on the sidewalls of emitter 50, plus the width of the tip of emitter 50. This provides for a simple method of creating a very small gate opening, without requiring expensive manufacturing techniques such as e-beam lithography. A small gate opening is desirable because it provides a higher electric field, thereby allowing for a reduced operating voltage for the emitter device.

One of the major advantages of this process is that the gated emitter is protected from contamination until the final step in the process of forming the self-aligned gated field emitter structure. The emitter tip is exposed only during the last step of etching dielectric layer 60 in the area of the tip, preventing any contaminant damage to the emitter that could occur during earlier processing steps.

Further advantages of the invention are a planar gate, and a thick dielectric. Since the invention results in a smooth gate layer, the gate-to-cathode capacitance is reduced. A thick dielectric is required to maintain the gate-to-cathode voltage with low leakage current and low capacitance. In the prior art processes, for instance in that shown in FIGS. 1 to 4, a reduction in the gate opening would require a corresponding reduction in the thickness of the dielectric layer, in order to maintain a correct emitter height. The invention provides a means to reduce the gate opening while maintaining sufficient dielectric thickness and emitter height.

Figure 10:
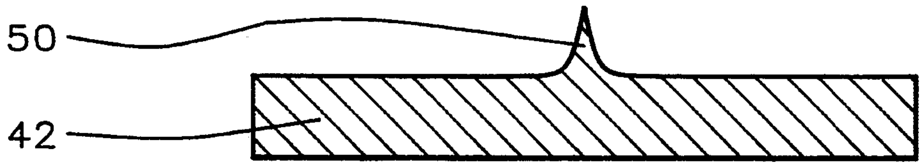

It will be recognized by those familiar with the art that the structure shown in FIG. 10 could be formed of other materials and by other methods. For instance, substrate 42 may be any crystalline, amorphous or the like material, such as silicon, amorphous silicon, polysilicon, molybdenum, tantalum, or the like, and is preferably polysilicon, since the resistivity can be adjusted by doping, and because polysilicon has higher mobility than amorphous silicon. Emitter 50 could be silicon, metal, or a metal-coated silicon material. The material used is preferred to have low work-function, such as rubidium (Rb), tantalum nitride (TAN), titanium carbide (TIC), chromium silicide ($Cr_3Si$), barium (Ba), cesium (Cs), or cermet ($Cr_3Si+SiO_2$), since these materials have high emissivity at the same operating voltage. The emitter material is also desired to have a high melting point, so materials such as molybdenum (Mo), tungsten (W), tantalum (Ta) and the like could be used, as they are tolerant to high temperatures created during emission.

In a second embodiment of the invention, shown in FIGS. 18 to 26, a stop material is used to provide an end point during planarization of the conductive gate layer. Three methods of this embodiment are shown. In the first method, processing is the same as in the first embodiment up to the FIG. 13 structure. A layer of stop material 80 consisting of aluminum oxide ($Al_2O_3$) is deposited conformally on thick dielectric 62 to form the structure shown in FIG. 18. The stop layer is deposited by sputtering, evaporation or CVD to a thickness of between about 500 and 2000 Angstroms.

Figure 19:
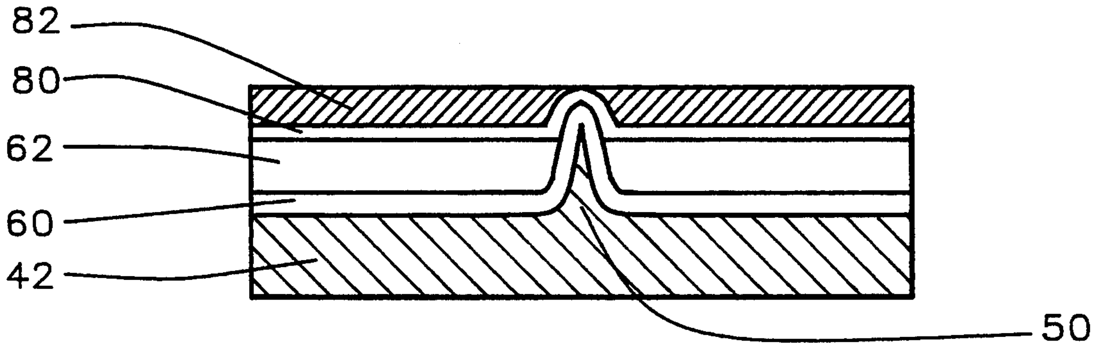
Figure 20:
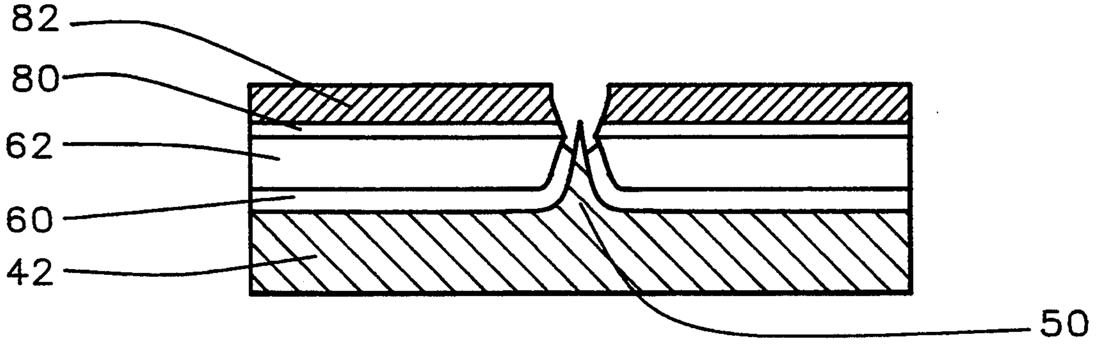

Referring now to FIG. 19, conductive gate layer 82 is deposited in the same way and using the same materials as in the first embodiment, and is then planarized back using stop material 80 as an end point. Planarization is accomplished by lapping or polishing. Processing continues as in the first embodiment by etching back gate layer 82 to a thickness of between about 1000 and 3000 Angstroms, and then the emitter tip is exposed. The emitter tip is exposed by first etching stop material 80 by phosphoric acid ($H_3PO_4$), and then etching thin dielectric 60. The resultant self-aligned gated field emitter is shown in FIG. 20. This method has all the advantages of the first embodiment, including the ability to establish a very small gate opening based on the thickness of the thin, conformal dielectric layer.

Figure 21:
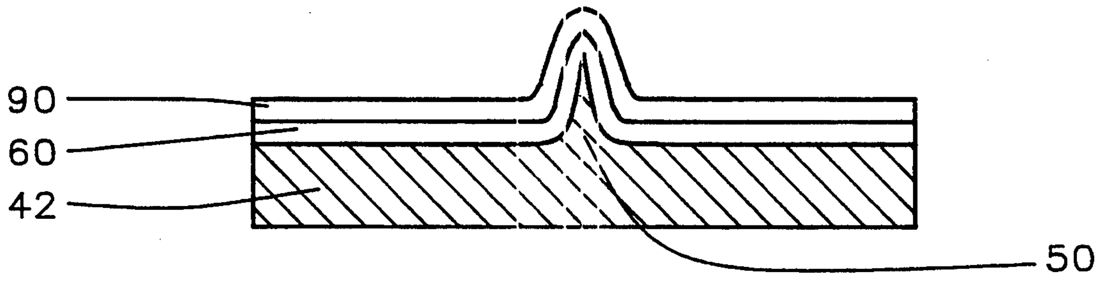
Figure 22:
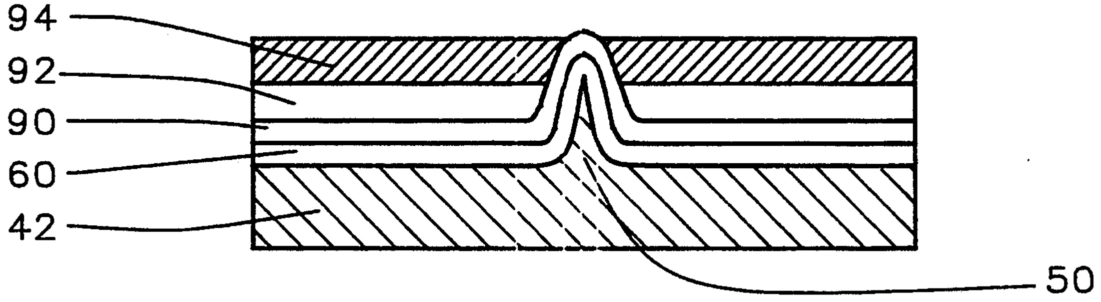
Figure 23:
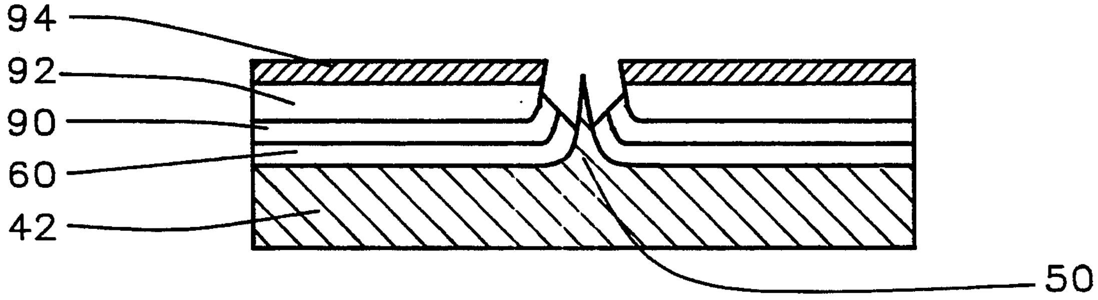

The second method of using a stop layer is shown in FIGS. 21 to 23. Starting from the FIG. 11 structure, a stop layer 90 of $Al_2O_3$ is deposited to a thickness of between about 500 and 2000 Angstroms over the thin, conformal dielectric layer 60 to create the FIG. 21 structure. Processing then continues as in the first embodiment, including forming a second dielectric layer 92 which is deposited, planarized and etched back, and a conductive gate layer 94 is deposited, planarized using layer 90 as an endpoint, and etched back, resulting in FIG. 22. Stop layer 90 and thin dielectric 60 are then etched as above to expose emitter 50, as shown in FIG. 23. In this method, the gate opening width is defined by the combined thickness of stop layer 90 and thin dielectric 60.

Figure 24:
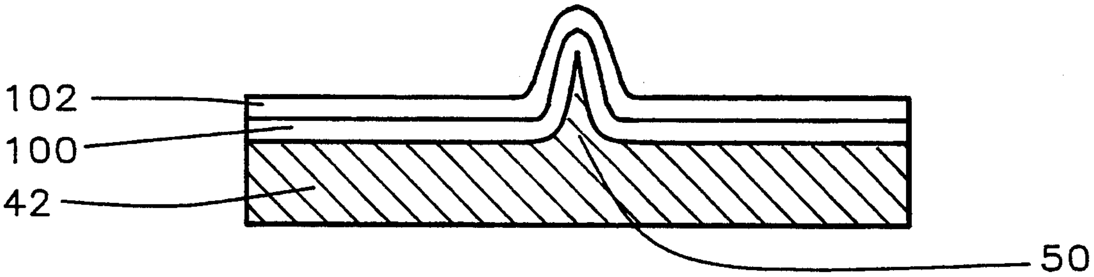
Figure 25:
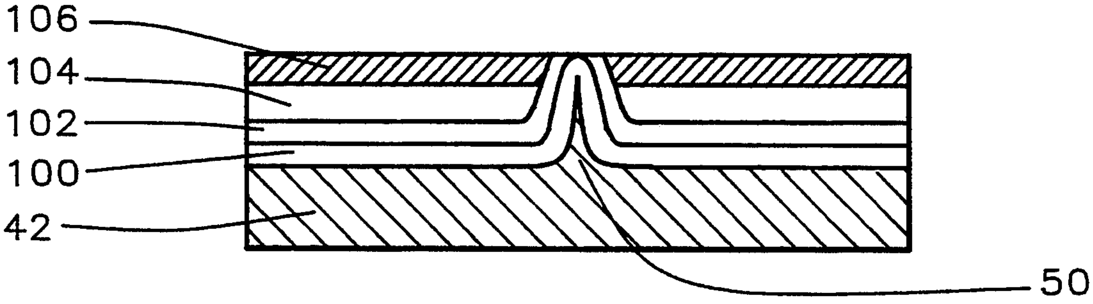
Figure 26:
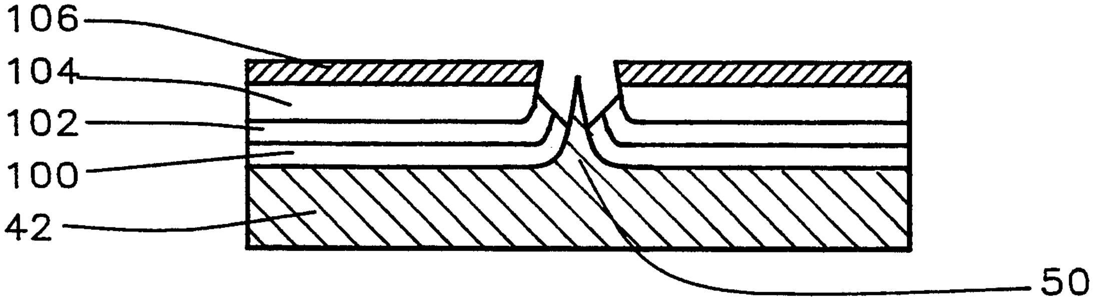

A final method using a stop layer is shown in FIGS. 24 to 26. As shown in FIG. 24, this is similar to the method of the preceding paragraph, except that the $Al_2O_3$ stop layer 100 and thin, conformal dielectric layer 102 are deposited in reverse order. Consequently, after deposition/planarization/etch of thick dielectric 104, and deposition of conductive gate layer 106, planarization of layer 106 removes a small portion of thin dielectric 102 before reaching stop layer 100, as shown in FIG. 25. Conductive layer 106 is then etched back, and stop layer 100 and thin dielectric 102 are etched as above to expose emitter 50, with the final structure shown in FIG. 26. As in the method described in the preceding paragraph, the gate opening width is defined by the combined thickness of stop layer 90 and thin dielectric 60. The major advantage for using the stop layer for the second embodiment is to provide a global uniformity of gate elevations of the gated-emitter array.

The invention not only increases the uniformity of gate elevation of the gated-emitter array but also significantly reduces the emitter contamination. Uniformity of gate elevation is particularly important for large area devices such as displays, in order to have uniform emission for each small section of the large area, and therefore to have controllable gray level and brightness in a display application.

While the invention has been particularly shown and described with reference to the preferred embodiments thereof, it will be understood by those skilled in the art that various changes in form and details may be made without departing from the spirit and scope of the invention.

What is claimed is:

1. The method of forming a self-aligned gated field emitter structure on a substrate, comprising the steps of:

forming a field emitter having a sharp tip on said substrate;

forming a thin, conformal dielectric layer over said field emitter and said substrate;

forming a thick dielectric layer over said think, conformal dielectric layer;

planarizing said thick dielectric layer;

etching back said thick dielectric layer;

forming a conductive layer over said thick dielectric planarizing said conductive layer;

etching back said conductive layer; and exposing said field emitter by removing a portion of said thin, conformal dielectric layer above and around said sharp tip of said field emitter.

2. The method of claim 1 wherein said thin, conformal dielectric layer is formed to a thickness of between about 1000 and 5000 Angstroms.

3. The method of claim 1 wherein said thin, conformal dielectric layer is silicon oxide.

4. The method of claim 3 wherein said thick dielectric is specially-cured spin-on glass, cured at a temperature of between about 105° and 155° C. for between about 25 and 35 minutes.

5. The method of claim 1 wherein said thin, conformal dielectric layer is silicon nitride.

6. The method of claim 5 wherein said thick dielectric is silicon oxide.

7. The method of claim 1 wherein said thin, conformal dielectric layer is silicon oxide.

8. The method of claim 7 wherein said thick dielectric is polyimide, cured at a temperature of between about 320° and 480° C. for between about 25 and 35 minutes.

9. The method of claim 1 wherein said conductive layer is the gate of said field emitter, and is formed of metal or polysilicon.

10. The method of claim 1 wherein said planarizing said conductive layer is by lapping or polishing.

11. The method of claim 1 wherein said etching back said thick dielectric layer is done until a small portion of said thin, conformal dielectric layer, above said field emitter, is exposed, and said etching back said conductive layer also is performed until a small portion of said thin, conformal dielectric layer is exposed, whereby an opening is formed in said conductive layer.

12. The method of claim 11 wherein said opening has a width that is determined by thickness of said thin, conformal dielectric layer.

13. The method of claim 1 wherein said etching back said thick dielectric layer is done until a small portion of said thin, conformal dielectric layer, above said field emitter, is exposed, and further comprising the steps of:

forming a layer of stop material over said thick dielectric layer after said etching back, over said small portion of said thin, conformal dielectric layer, and under said conductive layer, said stop material acting as a lapping or polishing stop during said planarizing of said conductive layer;

said etching back said conductive layer also is performed until a small portion of said thin, conformal dielectric layer is exposed, whereby an opening is formed in said conductive layer; and removing a portion of said layer of stop material during said exposing said field emitter.

14. The method of claim 13 wherein said opening has a width that is determined by thickness of said thin, conformal dielectric layer and thickness of said layer of stop material.

15. The method of claim 13 wherein said stop material is aluminum oxide.

16. The method of claim 1, and further comprising the steps of:

forming a layer of stop material in between said thin, conformal dielectric layer and said thick dielectric layer, said stop material acting as a lapping or polishing stop during said planarizing of said conductive layer;

said etching back said conductive layer is performed until a small portion of said thin, conformal dielectric layer is exposed, whereby an opening is formed in said conductive layer; and removing a portion of said layer of stop material during said exposing said field emitter.

17. The method of claim 16 wherein said opening has a width that is determined by thickness of said thin, conformal dielectric layer and thickness of said layer of stop material.

18. The method of claim 1, and further comprising the steps of:

forming a layer of stop material over said emitter and said substrate, and under said thin, conformal dielectric layer, said stop material acting as a lapping or polishing stop during said planarizing of said conductive layer;

removing a small portion of said thin, conformal dielectric layer during said planarizing of said conductive layer; and removing a portion of said layer of stop material during said exposing said field emitter.

19. The method of forming a self-aligned gated field emitter structure, comprising:

providing a substrate;

forming and patterning a first insulating layer on said substrate to create an etching mask;

removing a portion of said substrate in the region not masked by said etching mask, and also in a region under each edge of said etching mask to form an emitter structure, such that said regions under each edge approach each other;

removing said etching mask;

oxidizing said emitter structure;

etching said emitter structure to form a field emitter having a sharp tip;

forming a thin, conformal dielectric layer over said field emitter and said substrate;

forming a thick dielectric layer over said thin, conformal dielectric layer;

planarizing said thick dielectric layer;

etching back said thick dielectric layer;

forming a conductive layer over said thick dielectric layer;

planarizing said conductive layer;

etching back said conductive layer; and exposing said field emitter by removing a portion of said thin, conformal dielectric layer above and around said sharp tip of said field emitter.

20. A self-aligned gated field emitter structure, comprising:

a field emitter having a sharp tip on a substrate;

a thin insulating layer over said substrate and over a portion of said field emitter;

a conductive layer with an opening through which said tip of said field emitter is exposed;

a thick dielectric layer, formed of a different material than said thin insulating layer, between said thin insulating layer and said conductive layer; and a layer of aluminum oxide between said conductive layer and said substrate, wherein said layer of aluminum oxide is formed of a different material than said thin insulating layer or said thick dielectric layer.

21. The self-aligned gated field emitter structure of claim 20 wherein said thin, conformal dielectric layer has a thickness of between about 1000 and 5000 Angstroms.

22. The self-aligned gated field emitter structure of claim 20, wherein said opening has a diameter equal to the sum of two times the thickness of said thin insulating layer and the width of the tip of said field emitter.

23. The self-aligned gated field emitter structure of claim 20 wherein said layer of aluminum oxide is between said thick dielectric layer and said conductive layer.

24. The self-aligned gated field emitter structure of claim 20 wherein said layer of aluminum oxide is between said-thick dielectric layer and said thin insulating layer.

25. The self-aligned gated field emitter structure of claim 24 wherein said opening has a diameter equal to the sum of two times the thickness of said thin insulating layer, two times the thickness of said layer of aluminum oxide, and the width of the tip of said field emitter.

26. The self-aligned gated field emitter structure of claim 20 wherein said layer of aluminum oxide is between said substrate and said thin insulating layer.

27. The self-aligned gated field emitter structure of claim 26 wherein said opening has a diameter equal to the sum of two times the thickness of said thin insulating layer, two times the thickness of said layer of aluminum oxide, and the width of the tip of said field emitter.

* * * * *